United States Patent
Ying et al.

(10) Patent No.: US 10,622,986 B2
(45) Date of Patent: Apr. 14, 2020

(54) GATE VOLTAGE CONTROL CIRCUIT OF INSULATED GATE BIPOLAR TRANSISTOR AND CONTROL METHOD THEREOF

(71) Applicant: Delta Electronics (Shanghai) CO., LTD, Shanghai (CN)

(72) Inventors: Jianping Ying, Shanghai (CN); Ming Wang, Shanghai (CN); Xiaobo Huang, Shanghai (CN); Jun Liu, Shanghai (CN); Lifeng Qiao, Shanghai (CN); Xin Wang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/423,848

(22) Filed: May 28, 2019

(65) Prior Publication Data

US 2019/0280687 A1    Sep. 12, 2019

Related U.S. Application Data

(62) Division of application No. 15/910,027, filed on Mar. 2, 2018, now Pat. No. 10,367,496.

(30) Foreign Application Priority Data

Mar. 20, 2017   (CN) .......................... 2017 1 0166035

(51) Int. Cl.
| | | |
|---|---|---|
| *H03K 17/0812* | (2006.01) | |
| *H03F 1/52* | (2006.01) | |
| *H03F 3/213* | (2006.01) | |
| *H03F 3/217* | (2006.01) | |
| *H03K 17/082* | (2006.01) | |

(Continued)

(52) U.S. Cl.
CPC ....... *H03K 17/08128* (2013.01); *H03F 1/523* (2013.01); *H03F 3/213* (2013.01); *H03F 3/2173* (2013.01); *H03K 17/0828* (2013.01); *H03K 17/107* (2013.01); *H03K 17/168* (2013.01); *H01L 29/7395* (2013.01);
(Continued)

(58) Field of Classification Search
CPC ......... H03K 17/0814; H03K 17/08142; H03K 17/08144; H03K 17/08146; H03K 17/08148; H03K 17/082; H03K 17/0822; H03K 17/0824; H03K 17/0826; H03K 17/0828; H03K 17/16; H03K 17/161; H03K 17/165; H03K 17/168
USPC ....... 327/108–112, 379–381; 361/91.1, 91.5, 361/91.6
See application file for complete search history.

(56) References Cited

U.S. PATENT DOCUMENTS

2008/0084642 A1*  4/2008  Kato .................. H03K 17/0828
                                                         361/56
2013/0155560 A1*  6/2013  Takeuchi ................. H02H 3/20
                                                         361/89

* cited by examiner

*Primary Examiner* — Tomi Skibinski
(74) *Attorney, Agent, or Firm* — Yunling Ren

(57) ABSTRACT

The present disclosure discloses a gate voltage control circuit of an IGBT and a control method thereof. The gate voltage control circuit of the IGBT comprises a voltage control circuit, an active clamping circuit and a power amplifier circuit. A control voltage outputted by the voltage control circuit indirectly controls a gate voltage of the IGBT, so as to achieve a better control of the gate voltage of the IGBT with a smaller loss. It may prevent the active clamping circuit from a too-early response and may increase the active clamping circuit response speed; and may avoid the voltage oscillation of the collector-emitter voltage Vce and the gate (Continued)

voltage Vge, and may improve the reliability of the IGBTs connected in series.

8 Claims, 7 Drawing Sheets

(51) Int. Cl.
*H03K 17/10* (2006.01)
*H03K 17/16* (2006.01)
*H03F 3/21* (2006.01)
*H01L 29/866* (2006.01)
*H01L 29/739* (2006.01)

(52) U.S. Cl.
CPC .............. *H01L 29/866* (2013.01); *H03F 3/21* (2013.01); *H03F 2200/441* (2013.01); *H03F 2200/444* (2013.01)

US 10,622,986 B2

GATE VOLTAGE CONTROL CIRCUIT OF INSULATED GATE BIPOLAR TRANSISTOR AND CONTROL METHOD THEREOF

CROSS REFERENCE

This application is a divisional application of U.S. application Ser. No. 15/910,027 filed on Mar. 2, 2018, and is based upon and claims priority to Chinese Patent Application No. 201710166035.6 filed on Mar. 20, 2017, the entire contents thereof are incorporated herein by reference.

TECHNICAL FIELD

The present disclosure relates to the field of power electronics, in particular to a gate voltage control circuit of an insulated gate bipolar transistor and a control method thereof.

BACKGROUND

In high-voltage applications, in order to effectively increase the voltage level, IGBTs (Insulated Gate Bipolar Transistor) are connected in series. When the IGBTs are connected in series, voltages among the IGBTs are unbalanced and voltage spike of the IGBTs is higher. An active clamping circuit is usually added between a collector and a gate of the IGBT to improve the reliability of the IGBTs connected in series, and solve the problem that unbalanced voltages are among the IGBTs and voltage spike of the IGBTs is higher.

Accurate control of the gate voltage of the IGBT is an important guarantee for the reliable application of the active clamping circuit.

An active clamping circuit as shown in FIG. 1 is applied to IGBT. The active clamping circuit mainly comprises resistors, capacitors, diodes and more than one Zener diode.

More than one Zener diode, resistors and diodes are connected in series to form a branch 1, which is connected in parallel across the collector and the gate of the IGBT; a resistor and a capacitor are connected in series to form a branch 2, which is connected in parallel across the collector and the gate of the IGBT:

A control method of the active clamping circuit has following features:

the branch 1 responds to the magnitude of a collector-emitter voltage Vce of the IGBT. After the collector-emitter voltage Vce exceeds the reverse breakdown voltage (clamping voltage) of all Zener diodes in the branch 1, the Zener diodes in this branch 1 are broken down, and charges are injected into the gate of IGBT:

the branch 2 responds to the slope of the collector-emitter voltage Vce of the IGBT When the collector-emitter voltage Vce rises with a certain slope, charges are injected into the gate of the IGBT through the capacitor.

The charges injected into the gate of the IGBT by the branch 1 and the branch 2 can raise a gate voltage Vge above a threshold voltage Vgeth, so that the IGBT enters a turned-on state so as to reduce the collector-emitter voltage Vce of the IGBT.

The advantage of this control method is that it can effectively reduce the voltage spike when the IGBT is turned off. The disadvantages thereof are as follows: the active clamping circuit usually works at the moment when the IGBT is turned off, at this time a lower transistor of a power amplifier circuit in the last stage of a IGBT driving circuit is in an on-state, a large portion of charges injected into the gate of the IGBT are bypassed by the lower transistor, which reduces the effectiveness of the active clamping circuit and adds a significant loss on the Zener diodes. Especially when the active clamping circuit operates frequently, the loss on the Zener diodes is unacceptable.

In addition, there are still many problems and disadvantages in the active clamping circuit in the prior art, and the structure of the active clamping circuit is complex. The problem in the active clamping circuit shown in FIG. 1 has not been solved. Most of charges injected into the gate are bypassed by the lower transistor of the power amplifier circuit, the active clamping circuit is not highly effective. Or when the active clamping circuit works, the IGBT gate voltage Vge is uncontrollable, the gate voltage Vge is easily raised up to a higher magnitude. The IGBT is in on-state and the collector-emitter voltage Vce will drop largely. Then the gate voltage Vge drops and the collector-emitter voltage Vce rises again, such that both the collector-emitter voltage Vce and gate voltage Vge will oscillate.

Therefore, the present disclosure provides a novel control circuit and method for regulating the IGBT gate voltage.

The above information disclosed in this Background section is only for enhancement of understanding of the background of the disclosure, and therefore it may contain information that does not form the prior art that is already known to a person skilled in the art.

SUMMARY

The present disclosure provides a gate voltage control circuit for an insulated gate bipolar transistor that overcomes, at least to some extent, one or more problems due to limitations and disadvantages of the related art.

Other features and advantages of the present disclosure will become apparent from the following detailed description, or in part may be learned by practice of the invention.

According to a first aspect of the present disclosure, a gate voltage control circuit of an IGBT is disclosed, comprising:

an active clamping circuit comprising a first terminal, a second terminal, and a third terminal, the first terminal being connected with a collector of the IGBT for receiving a collector-emitter voltage of the IGBT, and the second terminal being connected with a gate of the IGBT;

a power amplifier circuit comprising a first terminal and a second terminal, the third terminal of the active clamping circuit being connected with the first terminal of the power amplifier circuit, the second terminal of the power amplifier circuit being coupled to the gate of the IGBT for outputting a gate voltage; and a voltage control circuit comprising a first terminal and a second terminal, wherein the first terminal of the voltage control circuit is configured to receive a drive signal, the second terminal of the voltage control circuit is connected with the third terminal of the active clamping circuit and the first terminal of the power amplifier circuit for outputting a control voltage which controls the gate voltage.

According to a second aspect of the present disclosure, a gate voltage control circuit of an IGBT is disclosed, comprising:

an active clamping circuit comprising a first terminal and a second terminal, the first terminal being connected with a collector of the IGBT for receiving a collector-emitter voltage of the IGBT, the second terminal being connected with a gate of the IGBT;

a power amplifier circuit comprising a first terminal and a second terminal, the first terminal of the power amplifier circuit receiving a drive signal; and a voltage control circuit comprising a first terminal and a second terminal, the first terminal of the voltage control circuit being connected with the second terminal of the power amplifier circuit, the second terminal of the voltage control circuit being coupled to the gate of the IGBT for outputting a gate voltage.

According to a third aspect of the present disclosure, a gate voltage control method of an IGBT is disclosed, comprising:

receiving a collector-emitter voltage of the IGBT by an active clamping circuit;

outputting a gate voltage by a power amplifier circuit:

receiving a drive signal and outputting a control voltage by a voltage control circuit; and controlling the gate voltage by the control voltage.

According to a fourth aspect of the present disclosure, a gate voltage control method of an IGBT is disclosed, comprising:

receiving a collector-emitter voltage of the IGBT by an active clamping circuit:

receiving and amplifying a drive signal by a power amplifier circuit; and receiving the amplified drive signal and outputting a gate voltage by a voltage control circuit.

According to the embodiment of the present disclosure, by adopting a simple control circuit structure, the gate voltage of the IGBT is effectively controlled with a smaller loss, so that the active clamping circuit can be prevented from working too early, and the active clamping circuit can make response quickly, to improve the active clamping effect. Avoid oscillation of the collector-emitter voltage and gate voltage when the active clamping circuit works. Reduce the loss on Zener diodes in IGBTs and the active clamping circuit, and greatly increase the reliability of IGBTs connected in series.

It is to be understood that both the foregoing general description and the following detailed description are exemplary only and should not be construed as limiting the present disclosure.

BRIEF DESCRIPTION OF THE DRAWINGS

The above and other objects, features, and advantages of the present disclosure will become more apparent by describing in detail example embodiments thereof with reference to the attached drawings.

DETAILED DESCRIPTION

Figure 1:
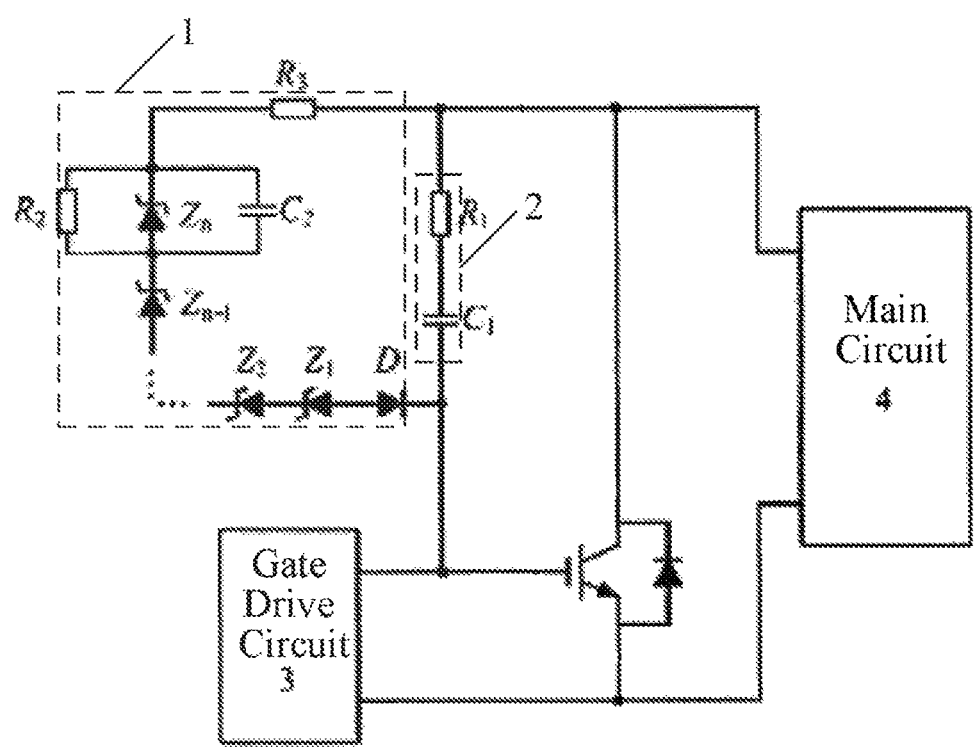
FIG. 1 shows an active clamping circuit diagram of an IGBT in prior art.

Example embodiments will now be described more fully with reference to the accompanying drawings. However, the example embodiments can be embodied in many forms and should not be construed as limited to the examples set forth herein; rather, these embodiments are provided so that the description of the invention will be more comprehensive and complete, and will fully convey the concept of the example embodiments to those skilled in the art. The drawings are merely schematic representations of the present disclosure and are not necessarily drawn to scale.

Furthermore, the described features, structures, or characteristics may be combined into one or more embodiments in any suitable manner. In the following description, numerous specific details are given to provide a thorough understanding of embodiments of the invention. However, one skilled in the art will realize that one or more of the specific details may be omitted when practicing the technical solutions of the present disclosure, or that other methods, components, steps, etc. may be employed. In other instances, well-known structures, methods, implementations, or operations are not shown or described in detail to avoid obscuring aspects of the present disclosure.

Some of the block diagrams shown in the drawings are functional entities and do not necessarily correspond to physically or logically separate entities. These functional entities may be implemented in one or more hardware modules or integrated circuits, or implemented in different networks and/or processor devices and/or microcontroller devices.

The present disclosure discloses a gate voltage control circuit of an IGBT, which comprises an active clamping circuit, a power amplifier circuit and a voltage control circuit. One manner is that the active clamping circuit is arranged between a collector of the IGBT and the power amplifier circuit and a gate of the IGBT; the voltage control circuit is arranged in front stage of the power amplifier circuit; the voltage control circuit consists of a transistor, diodes, Zener diodes and resistors. The gate voltage $V_{ge}$ received by the gate of the IGBT is indirectly controlled by a control voltage outputted by the voltage control circuit. Another manner is that the active clamping circuit is arranged between the voltage control circuit and the gate of the IGBT, the voltage control circuit is arranged between the power amplifier circuit and the gate of the IGBT, and the voltage control circuit directly controls the gate voltage $V_{ge}$ received by the gate of the IGBT. The above two manners can effectively control the gate voltage of the IGBT with a smaller loss, which can prevent the active clamping circuit from responding too early and improve the response speed of the active clamping circuit, and greatly shorten the response time of the active clamping, and improve the effect of the active clamping, and avoid oscillation of the collector-emitter voltage $V_{ce}$ and the gate voltage $V_{ge}$ when the active clamping circuit responds, and reduce the loss of the Zener diodes in the IGBT and the active clamping circuit, and greatly increase the reliability of IGBTs connected in series.

Figure 2:
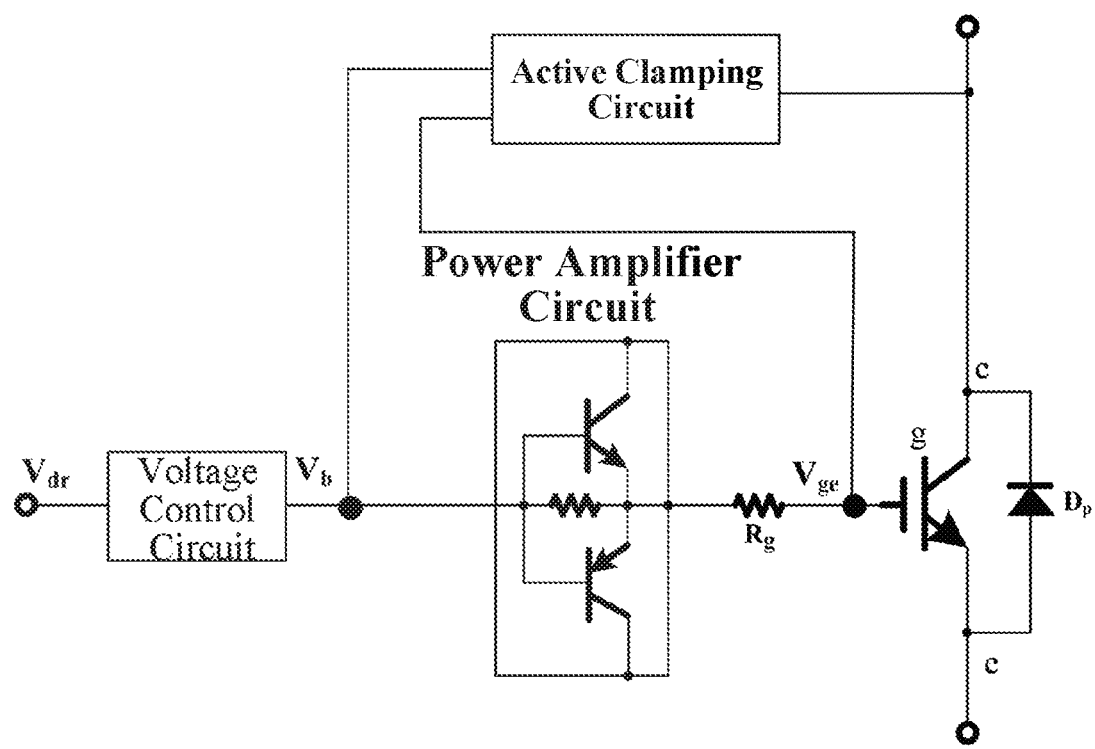
FIG. 2 shows a schematic diagram of a gate voltage control circuit of an IGBT according to an example embodiment of the present disclosure.
Figure 3:
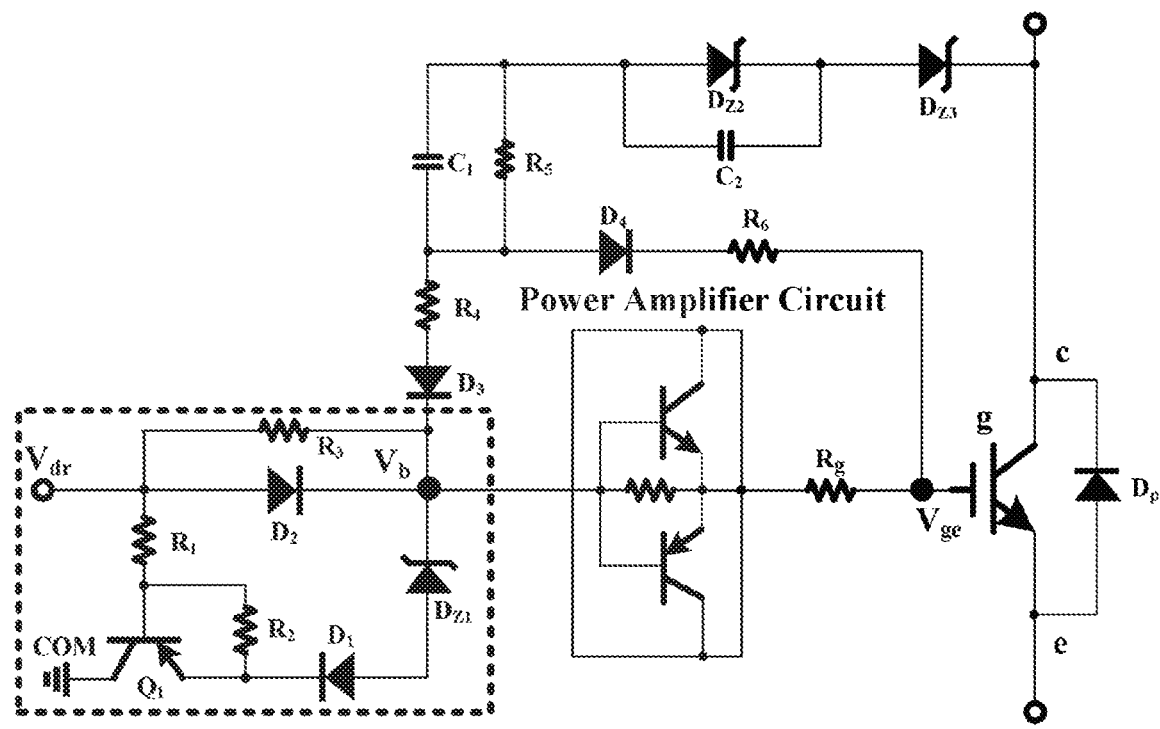
FIG. 3 shows a circuit diagram of a gate voltage control circuit of an IGBT according to an example embodiment of the present disclosure.
Figure 4:
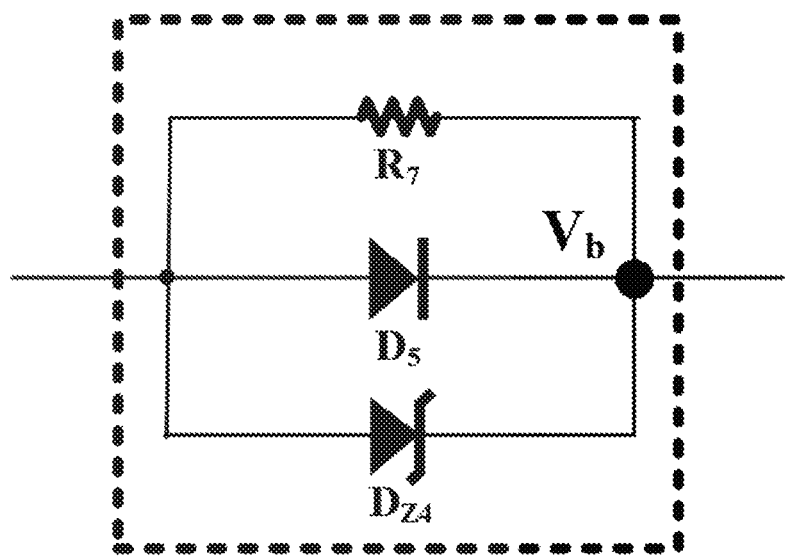
FIG. 4 shows a circuit diagram of another modification of the voltage control circuit in the gate voltage control circuit of the IGBT according to an example embodiment of the present disclosure as shown in FIG. 2.
Figure 5:
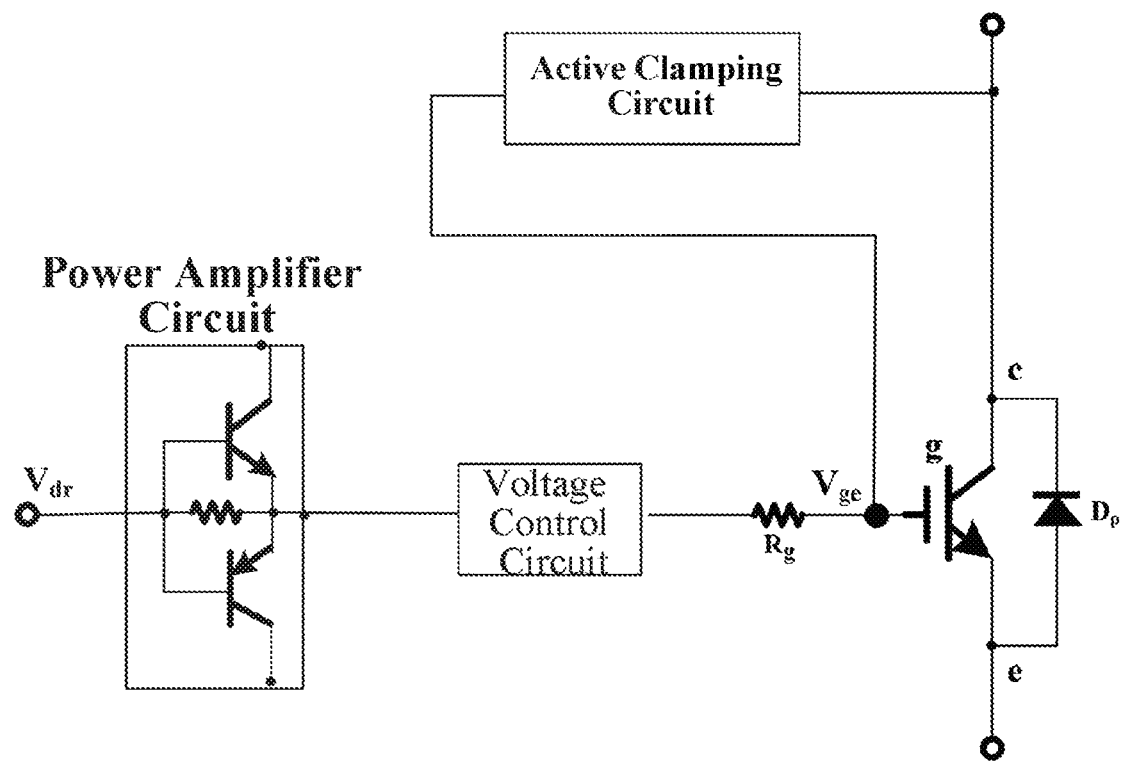
FIG. 5 shows a schematic diagram of a gate voltage control circuit of an IGBT according to another example embodiment of the present disclosure.
Figure 6:
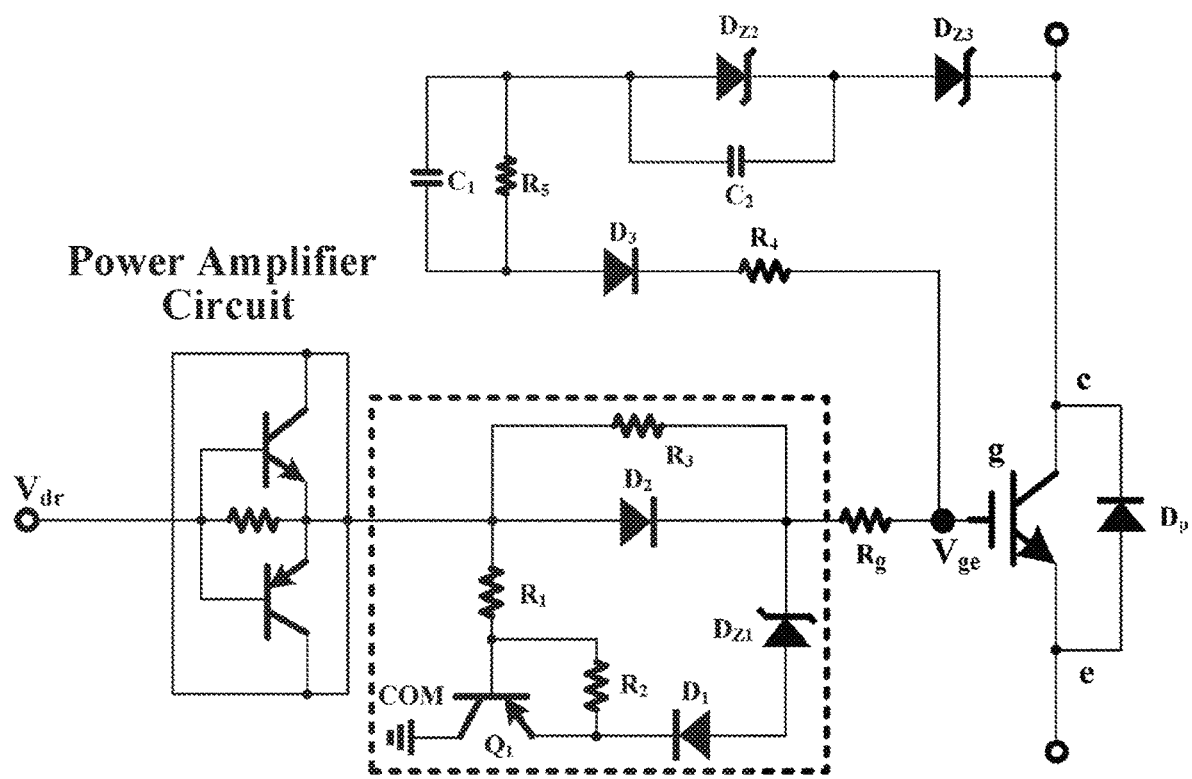
FIG. 6 shows a circuit diagram of a gate voltage control circuit of an IGBT according to another example embodiment of the present disclosure.
Figure 7:
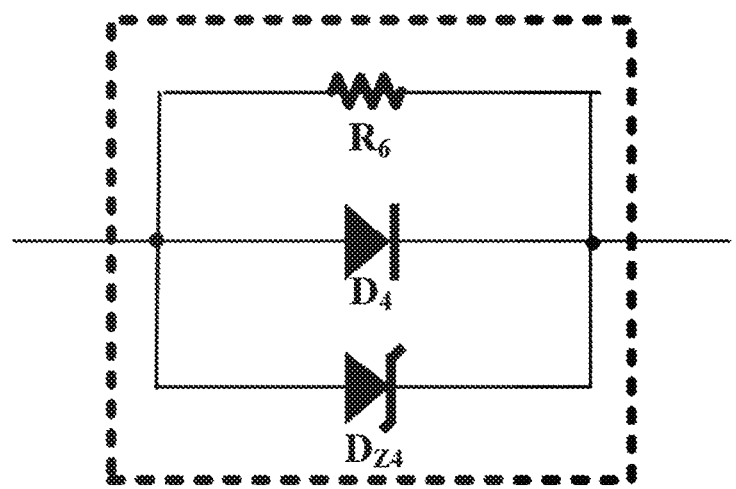
FIG. 7 shows a circuit diagram of another modification of the voltage control circuit in the gate voltage control circuit of the IGBT according to another exemplary embodiment of the present disclosure as shown in FIG. 5.

In the embodiment shown in FIGS. 2 to 4, the active clamping circuit in the gate voltage control circuit of the IGBT of the present disclosure has an input terminal (i.e., a first terminal) and two output terminals (i.e., a second terminal and a third terminal), wherein the input terminal is connected with the collector of the IGBT, the two output terminals are respectively coupled to the input terminal of the power amplifier circuit and the gate of the IGBT, and the voltage control circuit is located in front stage of the power amplifier circuit for receiving a drive signal Vdr, wherein the drive signal Vdr is outputted by a pulse width modulation circuit (not shown); in the embodiments shown in FIGS. 5 to 7, the active clamping circuit in the gate voltage control circuit of the IGBT of the present disclosure has an input terminal (i.e., a first terminal) and an output terminal (i.e., a second terminal), wherein the input terminal is connected with the collector of the IGBT, and the output terminal is coupled to the gate of the IGBT, and the voltage control circuit is located between the output terminal of the power amplifier circuit and the gate of the IGBT.

Hereinafter, the above two cases are respectively described in detail with reference to the accompanying drawings.

FIG. 2 shows a schematic diagram of a gate voltage control circuit of an IGBT according to an exemplary embodiment of the present disclosure, FIG. 3 shows a circuit diagram of a gate voltage control circuit of an IGBT according to an exemplary embodiment of the present disclosure, and FIG. 4 shows a circuit diagram of another modification of the voltage control circuit in the gate voltage control circuit of the IGBT according to an example embodiment of the present disclosure as shown in FIG. 2. In the embodiment according to FIGS. 2 to 4, the active clamping circuit in the gate voltage control circuit of IGBT has two output terminals, the two output terminals being respectively coupled to the input terminal of the power amplifier circuit and the gate of the IGBT. The voltage control circuit is disposed in front of the power amplifier circuit for receiving the drive signal Vdr. The specific description will be made with reference to the accompanying drawings.

As shown in FIG. 2, the gate voltage control circuit of the IGBT comprises: an active clamping circuit comprising a first terminal, a second terminal and a third terminal, the first terminal being connected with a collector c of the IGBT for receiving a collector-emitter voltage $V_{ce}$ of the IGBT, and the second terminal being connected with a gate g of the IGBT; a power amplifier circuit comprising a first terminal and a second terminal, the third terminal of the active clamping circuit being connected with the first terminal of the power amplifier circuit, the second terminal of the power amplifier circuit being coupled to the gate g of the IGBT for outputting a gate voltage $V_{ge}$; and a voltage control circuit comprising a first terminal and a second terminal, wherein the first terminal of the voltage control circuit is configured to receive a drive signal $V_{dr}$, the drive signal is outputted by a pulse width modulation circuit (not shown), the second terminal of the voltage control circuit is connected with the third terminal of the active clamping circuit and the first terminal of the power amplifier circuit for outputting a control voltage $V_b$ to indirectly control the gate voltage $V_{ge}$.

When the IGBT starts to be turned off, the collector-emitter voltage Vce starts to rise. At this time, the collector-emitter voltage Vce does not reach the clamping voltage. That is, the collector-emitter voltage Vce is less than the clamping voltage, and the variation slope of the collector-emitter voltage Vce is du/dt and the active clamping circuit injects charges into the gate g of the IGBT and the second terminal of the voltage control circuit. In this case, the voltage control circuit controls the voltage Vb and thereby indirectly controls the gate voltage Vge, so that the gate voltage Vge does not exceed the gate threshold voltage $V_{gcth}$ of the IGBT, to prevent the active clamping from acting too early and avoid unnecessary loss.

After the collector-emitter voltage Vce of the IGBT rises above the clamping voltage, i.e., the collector-emitter voltage Vce of the IGBT is greater than or equal to the clamping voltage, the Zener diode in the active clamping circuit (a well-known active clamping circuit usually comprises Zener diodes) is broken down. The charges injected into the gate g of the IGBT and the second terminal of the voltage control circuit increase greatly, and the gate voltage Vge can be rapidly pulled up to the gate threshold voltage $V_{geth}$, but the gate voltage Vge doesn't reach the gate voltage of the IGBT which is normally turned on. The response time of the active clamping circuit is greatly reduced, and the collector-emitter voltage Vce can be immediately clamped, and the clamping effect is improved. It should be noted that when the collector-emitter voltage Vce drops below the clamping voltage, the active clamping circuit no longer injects charges into the gate g of the IGBT and the second terminal of the voltage control circuit. In addition, the control voltage Vb outputted by the voltage control circuit indirectly controls the gate voltage Vge such that the gate voltage Vge of the IGBT is less than a preset voltage (the preset voltage is greater than the gate threshold voltage $V_{geth}$ and less than the gate voltage (e.g., 15V) of the IGBT which is normally turned on), so as to prevent the gate voltage Vge from being raised to a higher magnitude that causes the IGBT normally turned on, thereby preventing the gate voltage Vge and the collector-emitter voltage Vce from oscillating. It should be noted that, after the active clamping circuit operates, the collector-emitter voltage Vce of the IGBT is clamped to an appropriate voltage range. At this time, the gate voltage Vge of the IGBT is greater than the gate threshold voltage $V_{geth}$ and less than the gate voltage of the IGBT which is normally turned on.

The gate voltage control circuit of the IGBT further comprises a gate driving resistor Rg, and the second terminal of the power amplifier circuit is connected with the gate g of the IGBT through the gate driving resistor Rg.

In addition, an anti-parallel diode Dp is connected across the above-mentioned collector c and emitter of the IGBT As shown in FIG. 3, according to an embodiment of the present disclosure, the voltage control circuit comprises a first transistor Q1, first to third resistors R1-R3, first to second diodes D1-D2 and a first Zener diode Dz1. A first terminal of the first resistor R1, an anode of the second diode D2, and a first terminal of the third resistor R3 are electrically connected with the first terminal of the voltage control circuit for receiving the drive signal Vdr; a second terminal of the first resistor R1 and a base of the first transistor Q1 are electrically connected with a first terminal of the second resistor R2; a collector of the first transistor Q1 is electrically connected with the ground line COM; an emitter of the first transistor Q1 and a second terminal of the second resistor R2 are electrically connected with a cathode of the first diode D1; an anode of the first diode D1 is electrically connected with an anode of the first Zener diode Dz1; a cathode of the first Zener diode Dz1, a cathode of the second diode D2, and a second terminal of the third resistor R3 are electrically connected with the second terminal of the voltage control circuit for outputting the control voltage Vb.

The active clamping circuit comprises third to fourth diodes D3-D4, fourth to sixth resistors R4-R6, first to second capacitors C1-C2, and second to third Zener diodes Dz2-Dz3. A cathode of the third diode D3 is connected with the third terminal of the active clamping circuit; an anode of the third diode D3 is electrically connected with a first terminal of the fourth resistor R4; a second terminal of the fourth resistor R4, a first terminal of the first capacitor C1 and a first terminal of the fifth resistor R5 are electrically connected with an anode of the fourth diode D4; a second terminal of the first capacitor C1, a second terminal of the fifth resistor R5 and an anode of the second Zener diode Dz2 are electrically connected with a first terminal of the second capacitor C2; a cathode of the second Zener diode Dz2 and a second terminal of the second capacitor C2 are electrically connected with an anode of the third Zener diode Dz3; a cathode of the third Zener diode Dz3, which is connected with the first terminal of the active clamping circuit, is connected with the collector c of the IGBT; a cathode of the fourth diode D4 is electrically connected with a first terminal of the sixth resistor R6; a second terminal of the sixth resistor R6, which is connected with the second terminal of the active clamping circuit, is connected with the gate g of the IGBT.

In the present embodiment, when the active clamping circuit is in operation, the gate voltage of the IGBT is a negative voltage (which is assumed to be −15V, and the same applies to all other embodiments).

Before the IGBT starts to be turned off and the collector-emitter voltage Vce reaches the clamping voltage, the variation slope of the collector-emitter voltage Vce is du/dt and a Zener diode junction capacitance of the active clamping circuit injects charges into the gate g of the IGBT and the second terminal of the voltage control circuit, such that both the control voltage Vb and the gate voltage Vge are raised. When the control voltage Vb rises above the clamping value (e.g., 5.1V) of the Zener diode Dz1, the Zener diode Dz1 is broken down, thereby the transistor Q1 is turned on, and the control voltage Vb is clamped to 5.1V. As the control voltage Vb is clamped, more charges are injected into the gate g of the IGBT, so that the gate voltage Vge is further raised. When the gate voltage Vge is higher than the control voltage Vb, the lower transistor in the power amplifier circuit is turned on, so that the gate voltage Vge is decreased to be equal to the control voltage Vb, and then the lower transistor in the power amplifier circuit is turned off. The voltage control circuit indirectly controls the gate voltage Vge through the control voltage Vb. Since the gate threshold voltage $V_{geth}$ of the IGBT is usually about 6V, the gate voltage Vge is slightly less than the gate threshold voltage $V_{geth}$, the IGBT is not turned on, and the active clamping circuit does not operate in advance, and therefore no unnecessary loss is generated.

When the collector-emitter voltage Vce rises to the clamping voltage, the Zener diodes in the active clamping circuit are all broken down. At this time, the charges injected into the gate g of the IGBT and the second terminal of the voltage control circuit will increase greatly. Since the gate voltage Vge is already in the vicinity of the gate threshold voltage $V_{geth}$, the gate voltage Vge can be rapidly pulled up above the gate threshold voltage $V_{geth}$ and does not reach the gate voltage of the IGBT which is normally turned on, thus the active clamping response time is greatly reduced, and the clamping effect is improved. Moreover, since the control voltage Vb outputted by the voltage control circuit indirectly controls the gate voltage Vge as well, such that the gate voltage Vge of the IGBT is less than a preset voltage (the preset voltage is greater than the gate threshold voltage $V_{geth}$ and less than the gate voltage of the IGBT which is normally turned on), so as to prevent the gate voltage Vge from being raised to a higher value to normally turn on the IGBT, avoid the gate voltage Vge and collector-emitter voltage Vce to oscillate, and greatly increase the reliability of IGBTs connected in series.

The voltage control circuit in the above embodiment mainly comprises a transistor, resistors, diodes and Zener diodes. The voltage control circuit in the embodiment described below comprises only one resistor, one diode and one Zener diode.

As shown in FIG. 4, the voltage control circuit comprises a seventh resistor R7, a fifth diode D5 and a fourth Zener diode Dz4. A first terminal of the seventh resistor R7, an anode of the fifth diode D5, and an anode of the fourth Zener diode Dz4 are electrically connected with the first terminal of the voltage control circuit for receiving the drive signal Vdr. A second terminal of the seventh resistor R7, a cathode of the fifth diode D5, and a cathode of the fourth Zener diode Dz4 are electrically connected with the second terminal of the voltage control circuit for outputting the control voltage Vb.

It is assumed that the fourth Zener diode Dz4 has a regulated voltage of 20V. Before the collector-emitter voltage Vce reaches the clamping point, the control voltage Vb outputted by the voltage control circuit is about 5V, and then the gate voltage Vge is indirectly controlled at about 5V to ensure that the active clamping circuit does not operate in advance. After the collector-emitter voltage Vce rises and reaches the clamping point, the charges injected into the gate g of the IGBT by the active clamping circuit can immediately pull the gate voltage Vge above the gate threshold voltage $V_{geth}$ and not reaching the gate voltage of the IGBT which is normally turned on, so that the gate voltage Vge of the IGBT is less than a preset voltage, which is greater than the gate threshold voltage Vgeth and less than the gate voltage of the IGBT which is normally turned on. At this time, the active clamping circuit may immediately operate, and meanwhile the control circuit can control the gate voltage Vge by outputting the control voltage Vb, so as to prevent the gate voltage Vge from reaching a higher value and prevent the gate voltage Vge and the collector-emitter voltage Vce from oscillating.

FIG. 5 shows a schematic diagram of a gate voltage control circuit of an IGBT according to another example embodiment of the present disclosure, FIG. 6 shows a circuit diagram of a gate voltage control circuit of an IGBT according to another example embodiment of the present disclosure, and FIG. 7 shows a circuit diagram of another modification of the voltage control circuit in the gate voltage control circuit of the IGBT according to another exemplary embodiment of the present disclosure as shown in FIG. 5. In the embodiment according to FIGS. 5 to 7, the active clamping circuit in the IGBT gate voltage control circuit of the present disclosure is arranged between the voltage control circuit and the gate g of the IGBT, and the voltage control circuit is arranged between the power amplifier circuit and the gate g of the IGBT, wherein the voltage control circuit directly controls the gate voltage Vge received by the gate of the IGBT.

As shown in FIG. 5, a gate voltage control circuit of an IGBT comprises: an active clamping circuit comprising a first terminal and a second terminal, the first terminal being connected with a collector c of the IGBT for receiving the a collector-emitter voltage Vce of the IGBT, the second terminal being connected with a gate g of the IGBT; a power amplifier circuit comprising a first terminal and a second terminal, the first terminal of the power amplifier circuit receiving a drive signal Vdr, wherein the drive signal Vdr is outputted by a pulse width modulation circuit (not shown), and a voltage control circuit comprising a first terminal and a second terminal, wherein the first terminal of the voltage control circuit is connected with the second terminal of the power amplifier circuit, and the second terminal of the voltage control circuit is coupled to the gate g of the IGBT for outputting the gate voltage Vge.

When the IGBT starts to be turned off, the collector-emitter voltage Vce starts to rise but does not reach the clamping voltage, that is, the collector-emitter voltage Vce is less than the clamping voltage, and the variation slope of the collector-emitter voltage Vce is du/dt and the voltage control circuit injects charges into the gate g of the IGBT and the voltage control circuit. At this time, the voltage control circuit can directly control the output gate voltage Vge, so that the gate voltage Vge does not exceed the gate threshold voltage $V_{geth}$, preventing the active clamping circuit from operating in advance.

After the collector-emitter voltage Vce of the IGBT rises above the clamping voltage, i.e., the collector-emitter voltage Vce of the IGBT is greater than or equal to the clamping voltage, the Zener diodes in the active clamping circuit (a well-known active clamping circuit usually includes Zener diodes) are broken down, at this time, the charges injected into the gate of the IGBT rapidly pull up the gate voltage Vge above the gate threshold voltage Vgeth and not reaching the gate voltage of the IGBT which is normally turned on, so that the gate voltage Vge is greater than the gate threshold voltage $V_{geth}$ and less than the preset voltage, and the active clamping circuit immediately operates. In addition, the voltage control circuit directly controls the gate voltage Vge to prevent the gate voltage Vge from being raised to a higher value, thereby effectively avoiding the oscillation of the gate voltage Vge and the collector-emitter voltage Vce.

The gate voltage control circuit of the IGBT further comprises a gate driving resistor Rg, and the voltage control circuit is connected with the gate g of the IGBT through the gate driving resistor Rg.

As shown in FIG. 6, according to an embodiment of the present disclosure, the voltage control circuit comprises a first transistor Q1, first to third resistors R1-R3, first to second diodes D1-D2, and a first Zener diode Dz1. A first terminal of the first resistor R1, an anode of the second diode D2, and a first terminal of the third resistor R3 are electrically connected with the first terminal of the voltage control circuit and the second terminal of the power amplifier circuit; a second terminal of the first resistor R1 and a base of the first transistor Q1 are electrically connected with a first terminal of the second resistor R2; a collector of the first transistor Q1 is electrically connected with the ground; an emitter of the first transistor Q1 and a second terminal of the second resistor R2 are electrically connected with a cathode of the first diode D1; an anode of the first diode D1 is electrically connected with an anode of the first Zener diode Dz1; a cathode of the first Zener diode Dz1, a cathode of the second diode D2, and a second terminal of the third resistor R3 are electrically connected with the second terminal of the voltage control circuit, and are coupled to the gate g of the IGBT.

The active clamping circuit comprises a third diode D3, fourth to fifth resistors R4-R5, first to second capacitors C1-C2, and second to third Zener diodes Dz2-Dz3, wherein a second terminal of the fourth resistor R4, which is connected with the second terminal of the active clamping circuit, is connected with the gate g of the IGBT; a cathode of the third diode D3 is electrically connected with a first terminal of the fourth resistor R4; a first terminal of the first capacitor C1 and a first terminal of the fifth resistor R5 are electrically connected with an anode of the third diode D3; a second terminal of the first capacitor C1, a second terminal of the fifth resistor R5 and an anode of the second Zener diode Dz2 are electrically connected with a first terminal of the second capacitor C2; a cathode of the second Zener diode Dz2 and a second terminal of the second capacitor C2 are electrically connected with an anode of the third Zener diode Dz3; a cathode of the third Zener diode Dz3, which is connected with the first terminal of the active clamping circuit, is connected with the collector c of the IGBT.

In this embodiment, it is assumed that the Zener diode in the voltage control circuit has a regulated voltage of 5.1V. Before the collector-emitter voltage Vce reaches the clamping point, the voltage control circuit can directly control the gate voltage Vge around 5V to ensure that the active clamping circuit does not operate in advance. After the collector-emitter voltage Vce rises and reaches the clamping point, the active clamping circuit injects charges into the gate g of the IGBT and the voltage control circuit, so that the gate voltage Vge can be immediately pulled up above the gate threshold voltage $V_{geth}$ and not reaching the gate voltage of the IGBT which is normally turned on, so that the gate voltage Vge is greater than the gate threshold voltage $V_{geth}$ and less than the preset voltage, the active clamping circuit can operate immediately, and meanwhile, the control circuit can prevent the gate voltage Vge from reaching a higher value, preventing the gate voltage Vge and the collector-emitter voltage Vce from oscillating.

The voltage control circuit in the above embodiment mainly comprises a transistor, resistors, diodes and Zener diodes. The voltage control circuit in the embodiment described below comprises only one resistor, one diode and one Zener diode.

As shown in FIG. 7, the voltage control circuit comprises a sixth resistor R6, a fourth diode D4, and a fourth Zener diode Dz4. A first terminal of the sixth resistor R6, an anode of the fourth diode D4, and an anode of the fourth Zener diode Dz4 are electrically connected with the first terminal of the voltage control circuit; a second terminal of the sixth resistor R6, a cathode of the fourth diode D4, and a cathode of the fourth Zener diode Dz4 are electrically connected with the second terminal of the voltage control circuit.

Suppose that the Zener diode Dz4 has a regulation voltage of 20V. Before the collector-emitter voltage Vce rises and reaches the clamping voltage, the voltage control circuit can directly control the gate voltage Vge at about 5V, to ensure that the active clamping circuit does not operate in advance. After the collector-emitter voltage Vce rises and reaches the clamping point, the active clamping circuit injects charges into the voltage control circuit and the gate g of the IGBT, and the gate voltage Vge can be immediately pulled up above the gate threshold voltage $V_{geth}$ and not reaching the gate voltage of the IGBT which is normally turned on, so that the gate voltage Vge is greater than the gate threshold voltage $V_{geth}$ and less than a preset voltage, the active clamping circuit can operate immediately, and meanwhile the control circuit prevents the gate voltage Vge from reaching a higher value, preventing the gate voltage Vge and the collector-emitter voltage Vce from oscillating.

In addition, according to another embodiment of the present disclosure, a gate voltage control method of an IGBT is disclosed, comprising: receiving a collector-emitter voltage Vce of the IGBT by an active clamping circuit; outputting a gate voltage Vge by a power amplifier circuit; receiving the drive signal Vdr and outputting a control voltage Vb by a voltage control circuit; and controlling the gate voltage Vge by the control voltage Vb.

According to an embodiment of the present disclosure, when the IGBT is turned off and the collector-emitter voltage Vce is less than a clamping voltage, the active clamping circuit injects charges into the voltage control circuit and the gate of the IGBT, the control voltage Vb output by the voltage control circuit controls the gate voltage Vge to be less than the gate threshold voltage Vgeth, so as to prevent the active clamping circuit from acting too early and avoid unnecessary loss.

According to an embodiment of the present disclosure, when the collector-emitter voltage Vce is greater than or equal to the clamping voltage, the active clamping circuit injects charges into the voltage control circuit and the gate g of the IGBT so that the gate voltage Vge is greater than a gate threshold voltage Vgeth, and the control voltage Vb outputted by the voltage control circuit controls the gate voltage Vge of the IGBT to be less than a preset voltage, so as to prevent the gate voltage Vge from being raised to a higher value to cause the IGBT normally turned on, preventing the gate voltage Vge and the collector-emitter voltage Vce from oscillating.

Further, according to still another embodiment of the present disclosure, a gate voltage control method of an IGBT is disclosed, comprising: receiving a collector-emitter voltage Vce of the IGBT by an active clamping circuit; receiving and amplifying a drive signal Vdr by a power amplifier circuit; and receiving the amplified drive signal Vdr and outputting a gate voltage Vge by a voltage control circuit.

According to an embodiment of the present disclosure, when the IGBT is turned off and the collector-emitter voltage Vce is less than the clamping voltage, the active clamping circuit injects charges into the gate g of the IGBT and the voltage control circuit, the gate voltage Vge outputted by the voltage control circuit is less than the gate threshold voltage Vgeth. In this case, the IGBT is not turned on, and the active clamping circuit does not operate earlier, so that unnecessary loss will not occur.

According to an embodiment of the present disclosure, when the collector-emitter voltage Vce is greater than or equal to the clamping voltage, the active clamping circuit injects charges into the gate g of the IGBT and the voltage control circuit, so that the gate voltage Vge outputted by the voltage control circuit is greater than the gate threshold voltage Vgeth and less than a preset voltage, and the active clamping circuit immediately operates. Meanwhile, the voltage control circuit directly controls the gate voltage Vge to prevent the gate voltage Vge from being raised to a higher value, which can effectively avoid the oscillation of the gate voltage Vge and the collector-emitter voltage Vce.

In summary, according to some embodiments of the present disclosure, the IGBT gate voltage Vge can be effectively controlled by a simple control circuit structure with a small loss, so as to prevent the active clamping circuit from operating too early, and reducing Zener diode loss in the IGBT and active clamp branch.

According to other embodiments of the present disclosure, the active clamping response time is greatly reduced when the collector-emitter voltage Vce rises above the clamping voltage, so as to effectively improve the active clamping effect, avoid the oscillation of the collector-emitter voltage Vce and the gate voltage Vge, and improve the reliability of the IGBTs connected in series.

Other embodiments of the present disclosure will be readily perceived to those skilled in the art upon consideration of the specification and practice of the inventions disclosed herein. This application is intended to cover any variations, uses, or adaptations of the invention that follow the general principles of the invention and comprise any common knowledge or customary technical means in the art that are not disclosed in the disclosure. It is intended that the specification and embodiments be considered as exemplary only, with a true scope and spirit of the invention being indicated by the following claims.

It should be understood that the present disclosure is not limited to the precise structures that have been described above and shown in the drawings, and various modifications and changes may be made without departing from the scope thereof. The scope of the present disclosure is limited only by the accompanying claims.

What is claimed is:

1. A gate voltage control circuit of an IGBT, comprising:
    an active clamping circuit comprising a first terminal and a second terminal, the first terminal being connected with a collector of the IGBT for receiving a collector-emitter voltage of the IGBT, the second terminal being connected with a gate of the IGBT;
    a power amplifier circuit comprising a first terminal and a second terminal, the first terminal of the power amplifier circuit receiving a drive signal; and
    a voltage control circuit comprising a first terminal and a second terminal, the first terminal of the voltage control circuit being connected with the second terminal of the power amplifier circuit, the second terminal of the voltage control circuit being coupled to the gate of the IGBT for outputting a gate voltage;
    wherein when the collector-emitter voltage is greater than or equal to a clamping voltage, the second terminal of the active clamping circuit injects charges into the gate of the IGBT and the voltage control circuit, and the gate voltage outputted by the voltage control circuit is greater than a gate threshold voltage and less than a preset voltage, the preset voltage being greater than the gate threshold voltage and less than a gate voltage value of the IGBT which is normally turned on.

2. The gate voltage control circuit of the IGBT according to claim 1, wherein the voltage control circuit comprises:
    a first transistor, first to third resistors, first to second diodes, and a first Zener diode,
    wherein, a first terminal of the first resistor, an anode of the second diode and a first terminal of the third resistor are electrically connected with the first terminal of the voltage control circuit;
    a second terminal of the first resistor and a base of the first transistor are electrically connected with a first terminal of the second resistor;
    a collector of the first transistor is electrically connected with the ground;
    an emitter of the first transistor and a second terminal of the second resistor are electrically connected with a cathode of the first diode;
    an anode of the first diode is electrically connected with an anode of the first Zener diode;
    a cathode of the first Zener diode, a cathode of the second diode, and a second terminal of the third resistor are electrically connected with the second terminal of the voltage control circuit.

3. The gate voltage control circuit of the IGBT according to claim 1, wherein the voltage control circuit comprises:
    a sixth resistor, a fourth diode, and a fourth Zener diode,
    wherein, a first terminal of the sixth resistor, an anode of the fourth diode and an anode of the fourth Zener diode are electrically connected with the first terminal of the voltage control circuit;
    a second terminal of the sixth resistor, a cathode of the fourth diode and a cathode of the fourth Zener diode are electrically connected with the second terminal of the voltage control circuit.

4. The gate voltage control circuit of the IGBT according to claim 1, wherein the active clamping circuit comprises: a third diode, fourth to fifth resistors, first to second capacitors, and second to third Zener diodes, wherein, a second terminal of the fourth resistor is connected with the second terminal of the active clamping circuit;

a cathode of the third diode is electrically connected with a first terminal of the fourth resistor;

a first terminal of the first capacitor and a first terminal of the fifth resistor are electrically connected with an anode of the third diode;

a second terminal of the first capacitor, a second terminal of the fifth resistor and an anode of the second Zener diode are electrically connected with a first terminal of the second capacitor;

a cathode of the second Zener diode and a second terminal of the second capacitor are electrically connected with an anode of the third Zener diode;

a cathode of the third Zener diode is connected with the first terminal of the active clamping circuit.

5. The gate voltage control circuit of the IGBT according to claim 1, wherein when the IGBT is turned off and the collector-emitter voltage is less than a clamping voltage, the second terminal of the active clamping circuit injects charges into the gate of the IGBT and the voltage control circuit, and the gate voltage outputted by the voltage control circuit is less than a gate threshold voltage.

6. The gate voltage control circuit of the IGBT according to claim 1, further comprising a gate driving resistor, the voltage control circuit being connected with the gate of the IGBT through the gate driving resistor.

7. A gate voltage control method of an IGBT, comprising:
    receiving a collector-emitter voltage of the IGBT by an active clamping circuit;
    receiving and amplifying a drive signal by a power amplifier circuit; and
    receiving the amplified drive signal and outputting a gate voltage by a voltage control circuit;
    wherein when the collector-emitter voltage is greater than or equal to a clamping voltage, the active clamping circuit injects charges into a gate of the IGBT and the voltage control circuit, and the gate voltage outputted by the voltage control circuit is greater than a gate threshold voltage and less than a preset voltage, the preset voltage being greater than the gate threshold voltage and less than a gate voltage value of the IGBT which is normally turned on.

8. The gate voltage control method of the IGBT according to claim 7, wherein when the IGBT is turned off and the collector-emitter voltage is less than a clamping voltage, the active clamping circuit injects charges into a gate of the IGBT and the voltage control circuit, and the gate voltage outputted by the voltage control circuit is less than a gate threshold voltage.

* * * * *